(12) United States Patent
Koslov

(10) Patent No.: US 6,253,347 B1
(45) Date of Patent: Jun. 26, 2001

(54) AUTOMATIC SYNCHRONIZATION CIRCUIT FOR TRELLIS DECODER

(75) Inventor: Joshua L. Koslov, Hopewell, NJ (US)

(73) Assignee: Hitachi America, Ltd., Tarrytown, NY (US)

( * ) Notice: Subject to any disclaimer, the term of this patent is extended or adjusted under 35 U.S.C. 154(b) by 0 days.

(21) Appl. No.: 09/135,182

(22) Filed: Aug. 17, 1998

Related U.S. Application Data
(60) Provisional application No. 60/064,308, filed on Nov. 5, 1997.

(51) Int. Cl.$^7$ .................................................. H03M 13/03
(52) U.S. Cl. ........................... 714/789; 714/790; 714/792
(58) Field of Search ..................................... 714/789, 790, 714/792; 375/286, 341, 200, 355, 210; 370/208

(56) References Cited

U.S. PATENT DOCUMENTS

| | | | | |
|---|---|---|---|---|
| 4,583,236 | * | 4/1986 | Kromer et al. | 375/286 |
| 4,807,230 | * | 2/1989 | Srinivasagopalan et al. | 714/789 |
| 5,050,191 | * | 9/1991 | No | 375/341 |
| 5,241,563 | * | 8/1993 | Paik et al. | 375/200 |
| 5,566,214 | * | 10/1996 | Kroeger et al. | 375/355 |
| 5,598,429 | * | 1/1997 | Marshall | 375/210 |
| 5,937,016 | * | 8/1999 | Choi | 375/341 |
| 6,058,101 | * | 5/2000 | Huang et al. | 370/208 |
| 6,092,234 | * | 7/2000 | Azakami et al. | 714/789 |

OTHER PUBLICATIONS

12 Mbps Convolutional Encoder—Viterbi Decoder STEL–2030A, Stanford Telecom, ASIC Custom Products Division, pp. 1–13, (Mar. 1992).

Convolutional Encodr, Viterbi Decoder STEL–2040, Stanford Telecom, ASIC Custom Products Division, pp. 1–14, (Oct. 1991).

Q1650 k=7 Multi–Code Rate Viterbi Decoder 2.5, 10, 25 Mbps Data Rates, Technical Data Sheet, Qualcomm, pp. 1–51, (Dec. 1991).

* cited by examiner

Primary Examiner—Albert Decady
Assistant Examiner—David Ton
(74) Attorney, Agent, or Firm—Straub & Pokotylo; Michael P. Straub

(57) ABSTRACT

Methods and apparatus for automatically generating a set partition adjustment renormalization rate (SPARR) threshold used to determine correct or incorrect set partition synchronization in a trellis decoder as a function of a renormalization rate are described. The invention makes use of the inventor's observation that when the system is properly synchronized, the rate of growth of cumulative error sums closely corresponds to an accumulation of minimum set partition errors. In accordance with the present invention a dummy accumulator is set up to accumulate the minimum set partition error for each symbol. If decoder set partition selection is correct the renormalization rate for the dummy accumulator will be approximately the same as an accumulator set up for the normal operation. In accordance with one embodiment, a fixed offset is added to the observed dummy renormalization rate, obtained through the use of the dummy accumulator(s), and the resulting sum is used as the automatically generated SPARR threshold. The automatic threshold generation technique of the present invention has the advantage of dynamically providing a SPARR threshold which changes as a function of changing SNR conditions without the need for operator input to achieve changes in threshold values.

24 Claims, 10 Drawing Sheets

FIGURE 4: STATE DIAGRAM

AUTOMATIC SYNCHRONIZATION CIRCUIT FOR TRELLIS DECODER

RELATED APPLICATION

This application claims the benefit of U.S. Provisional Application Ser. No. 60/064,308, filed Nov. 5, 1997 which is hereby expressly incorporated by reference.

FIELD OF THE INVENTION

The present invention relates to digital decoder circuits and, more particularly, to circuits for automatically determining a re-synchronization threshold to be used by, e.g., a trellis decoder.

BACKGROUND OF THE INVENTION

In various known trellis coding systems, different polynomials are used to encode different transmitted symbols. In order to properly decode a symbol stream received from such an encoder, a decoder must be synchronized such that it knows which received symbols were encoded with which polynomials. The outputs of the polynomials at the encoder (the encoded bits) are used to select the set partitions—subsets of the total set of symbol levels-to be transmitted. Additional, uncoded bits may be used to select levels within the selected set partitions. In decoding the received symbol, a trellis decoder determines the most likely sequence of set partitions used to generate the transmitted symbols. As part of this set-partition decoding process, the decoder must be properly synchronized to the sequence of polynomials used at the encoder.

Many trellis decoders maintain sets of what are referred to in the art as cumulative sums. These cumulative sums represent, e.g., a running estimate of errors associated with various decoding operations. In order to prevent the cumulative sums from exceeding the numerical capacity of registers used to store the cumulative sums, a fixed value is periodically subtracted from the stored cumulative sum values. This event is referred to as renormalization. Renormalization occurs at periodic intervals. The interval at which renormalization occurs normally varies as a function of the rate, e.g., an error rate, at which one or more of the cumulative sums grows. As the detected error rate increases the rate at which renormalization occurs increases in order to prevent the cumulative sums from overflowing the counters used to store the sums. The renormalization rate will generally be higher for a noisy signal than for a low noise signal. This is because more errors tend to occur in the case of high noise conditions. In addition, renormalization tends to occur more frequently in decoders in which the set partitions are improperly selected, e.g., the selection of set partitions used for decoding is not in sync with the actual set partitions original used to code the data being decoded. This can occur if synchronization with the sequence of transmitted polynomials is incorrect.

In some known trellis encoders, a set partition adjustment renormalization rate (SPARR) threshold is used to determine correct or incorrect polynomial and hence set partition synchronization. In the known systems the SPARR is an operator selected value that is supplied to the trellis decoder. The SPARR threshold is used to predict when the set partitions being used to decode data are incorrect and therefore synchronization of the set partition to be used when decoding received encoded data should be adjusted, in accordance with a corrected synchronization with a polynomial sequence. For example, if the SPARR threshold is exceeded, i.e., a renormalization rate which is higher than the threshold occurs, the set partition used to decode the received symbols will be adjusted in an attempt to achieve proper set partition synchronization with the received symbols.

A manually supplied SPARR threshold of prior art systems may be selected by an operator of the known system based upon some knowledge of the signal to noise ratio (SNR) of the communication channel used to transmit the received data and modified by the decoder operator during decoder use. This approach has the disadvantage of requiring a fair amount of operator input and can result, depending on the degree of operator input, in a decoder which is far less responsive to changing signal conditions than may be desired.

As an alternative to having an operator input the SPARR threshold, the threshold could be a pre-selected fixed value which was selected by the decoder designer to work over an anticipated range of signal conditions.

Unfortunately, a single pre-selected threshold may not work satisfactorily over the range of actual conditions encountered during decoder use.

In view of the above, it becomes apparent that there is a need for methods and apparatus of automatically selecting a satisfactory SPARR threshold for use by trellis decoders. It is desirable that any such methods and apparatus be relatively easy and inexpensive to implement. It is also desirable that any such methods and apparatus be responsive to changing signal conditions, e.g., SNR conditions, to automatically adjust the SPARR threshold as may be appropriate.

SUMMARY OF THE PRESENT INVENTION

As discussed above the present invention is directed to methods and apparatus for automatically determining a re-synchronization threshold, e.g., a SPARR threshold used by decoder, e.g., a trellis decoder.

In accordance with the present invention, a SPARR threshold is automatically calculated based upon the signal input, e.g., received symbols, to a trellis decoder. The automatic threshold determination method of the present invention is robust and can result in proper set partition synchronization over a wide and varying range of signal-to-noise conditions.

A trellis decoder operates, in part, by accumulating error metrics over time, which are the errors to particular set partitions. These error metrics are stored in the form of cumulative sums. Due to hardware architectures and limitations, these cumulative sums must, periodically, be decremented or "renormalized" by some fixed amount. In some trellis coding systems, the receiver must be synchronized with a pattern or grouping of symbols that recurs periodically. If this synchronization is incorrect, the cumulative sums will grow more rapidly than if the synchronization is correct: therefore, the cumulative sums will be renormalized more often than if the synchronization is correct. In order to determine the threshold above which the renormalization rate indicates incorrect synchronization, the current invention utilizes error metrics already existing in known trellis decoders.

The invention makes use of the inventor's observation that when the system is properly synchronized, the rate of growth of cumulative error sums closely corresponds to an accumulation of minimum set-partition errors. In accordance with the present invention a dummy accumulator is set up to accumulate the minimum set partition error for each symbol. If decoder set partition selection is correct the renormalization rate for the dummy accumulator(s) will be approximately the same as an accumulator set up for the normal operation. This assumes that the same or similar renormalization trigger conditions are applied to the dummy accumulator(s) and accumulator(s) used for normal operation. In accordance with one embodiment of the present invention, a fixed offset is added to this observed dummy renormalization rate, obtained through the use of the dummy accumulator, and the resulting sum is used as the automatically generated SPARR threshold.

The method and apparatus of the present invention can be implemented by adding relatively little hardware to that already in various known trellis decoders. In addition, the automatic threshold generation technique of the present invention has the advantage of dynamically providing a SPARR threshold which changes as a function of changing SNR conditions without the need for operator input to achieve the threshold changes.

DETAILED DESCRIPTION

The present invention is directed to methods and apparatus for improving trellis decoders.

Trellis decoders provide improved performance in the presence of noise by increasing the spacing of the symbol set through two or more set partitions.

Figure 1:
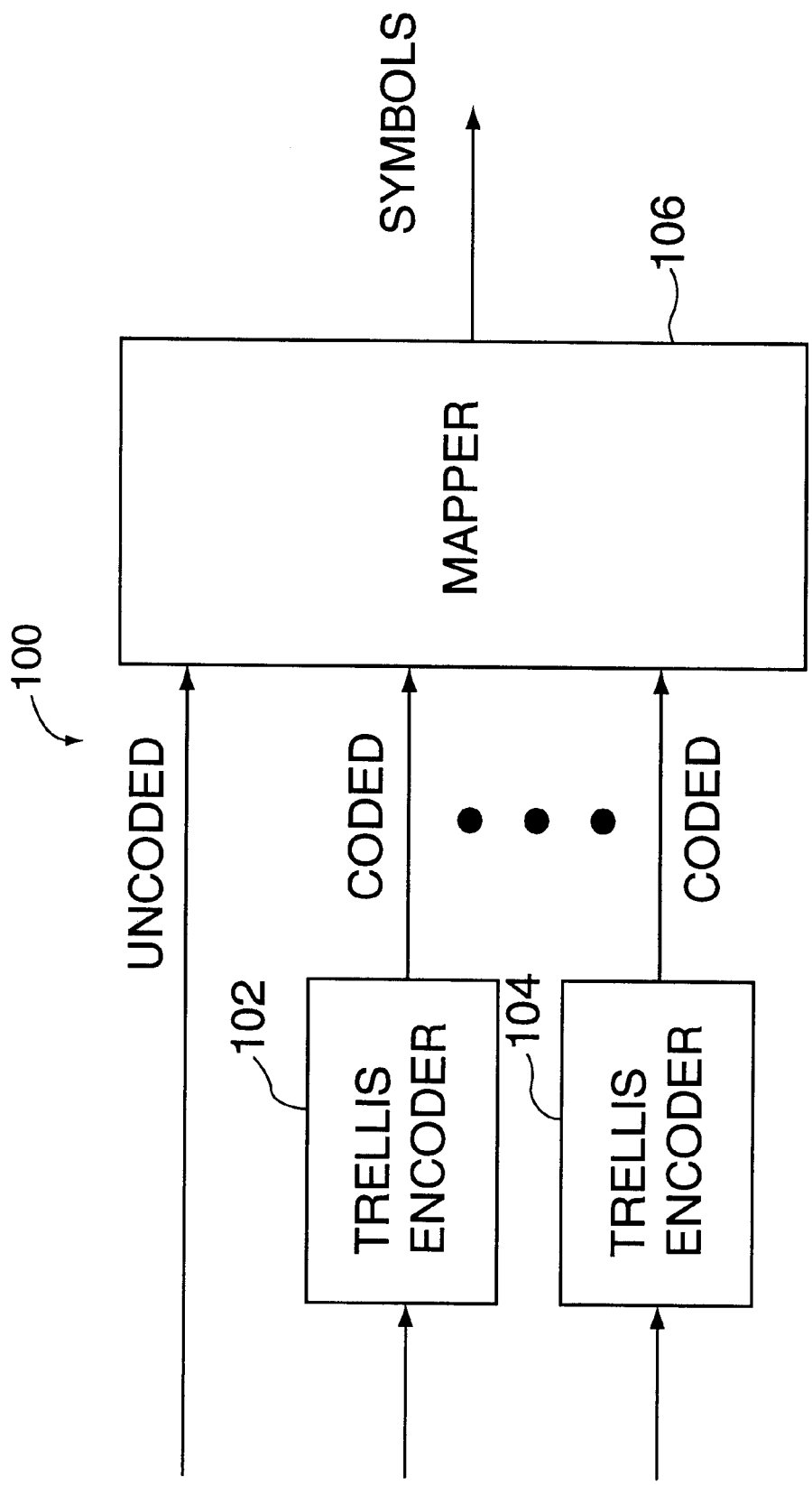
FIG. 1 illustrates an encoder which performs encoding using set partitions.

FIG. 1 illustrates an encoding apparatus 100 which uses the basic idea of encoding using set partitions. The encoding apparatus 100 includes first and second convolutional encoders, i.e., trellis encoders 102, 104 and a mapper 106. In accordance with the encoding technique illustrated in FIG. 1, input data bits are passed through one or more convolutional encoders, e.g., trellis encoders 102, 104, used to encode set partitions. Other data bits, e.g., the uncoded bits, are mapped along with the coded bits to symbols within the encoded set partitions by the mapper 106.

Figures 2A, 2B:
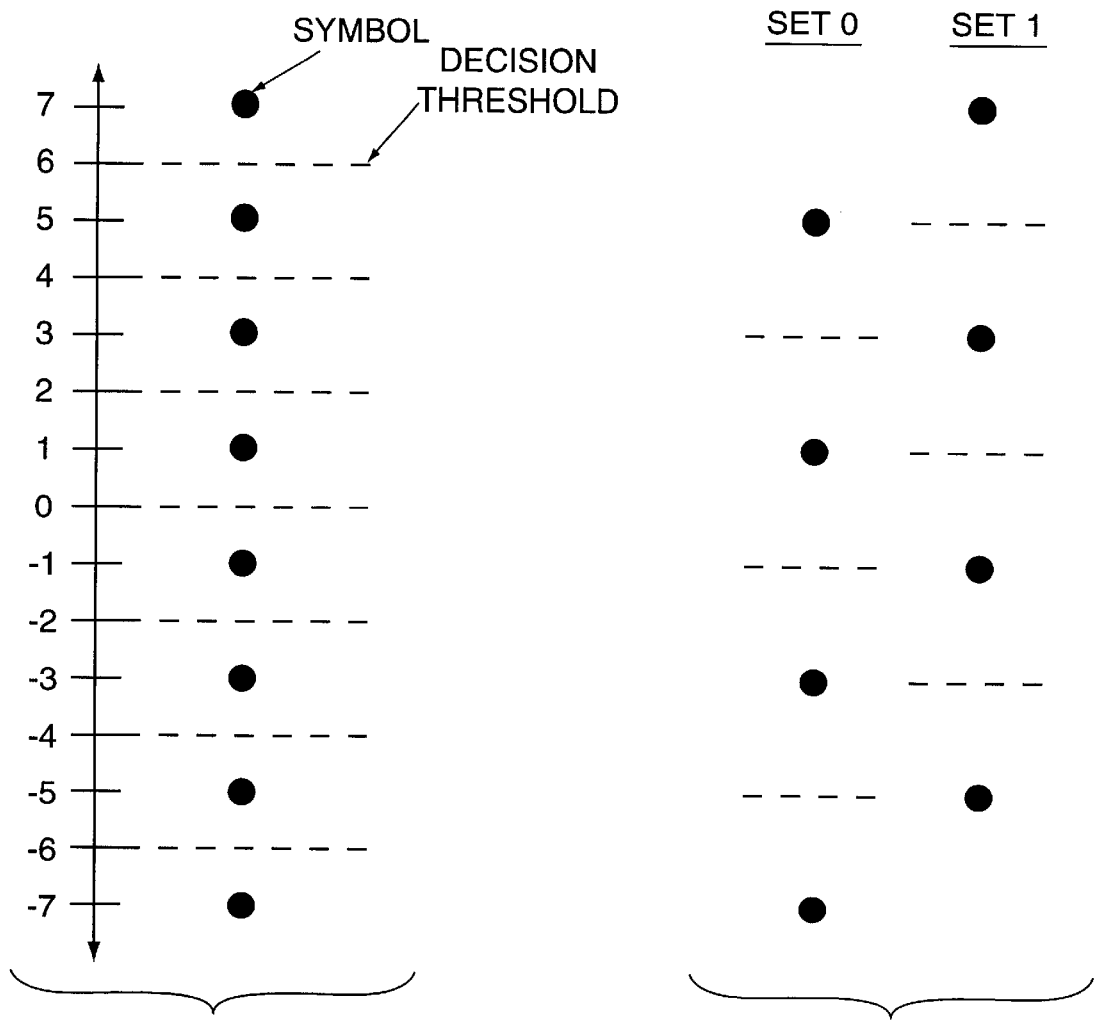
FIGS. 2A and 2B illustrate a symbol set and two set partitions, set 0 and set 1.

In FIG. 2A, a multilevel signal is shown. The symbols of the signal can take on possible levels $\{-7, -5, -3, -1, 1, 3, 5, 7\}$. The decision thresholds at the receiver (decoder) are $\{-6, -4, -2, 0, 2, 4, 6\}$. These thresholds are represented in FIG. 2A by the dotted lines. A noise vector of amplitude 1 can cause an incorrect decision in decoding the multilevel signal of FIG. 2A.

FIG. 2B also shows the same symbol constellation as shown in FIG. 2A, except that it has been divided into two set partitions SET 0 and SET 1. As illustrated in FIG. 2B, the symbol set for the Set 0 partition is $\{-7, -3, 1, 5\}$ with decision thresholds of $\{-5, -1, 3\}$. In addition, the symbol set for the Set 1 partition is $\{-5, -1, 3, 7\}$ with decision thresholds of $\{-3, 1, 5\}$. If we know which of the set partitions is used, then it takes an additive noise magnitude of 2 to cause an incorrect decision.

At decoding time it is a purpose of the trellis decoder to determine, with maximum likelihood, which set partition was used at the encoder end, in order that symbols at the receiver can be sliced against the appropriate set partition.

Figure 3:
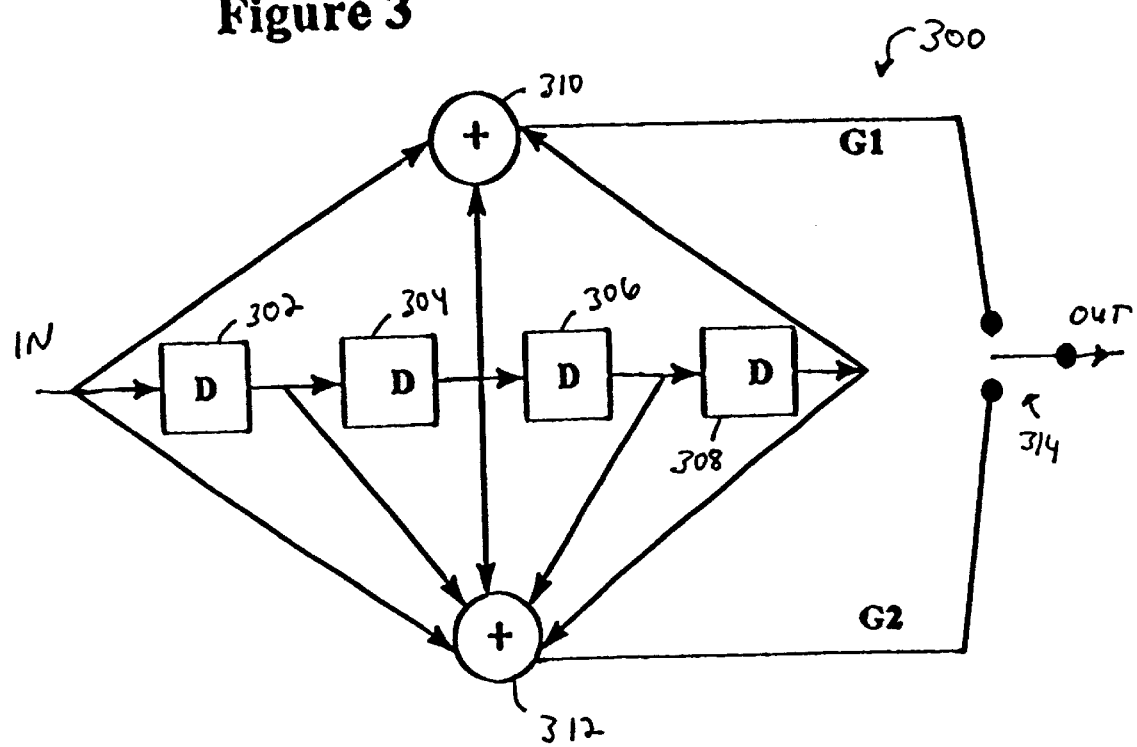
FIG. 3 illustrates a trellis encoder.

In order to understand the encoding and decoding processes of the trellis coded system, a trellis diagram, based upon the encoder, is useful. An exemplary convolutional encoder 300 is shown in FIG. 3. The encoder 300 comprises 4 delay elements 302, 304, 306, 308, two summers 310, 312 and a switch 314 coupled together as illustrated in FIG. 3. This encoder has 16 states($16=2^4$), corresponding to the combination of states which can be achieved using the two possible state conditions of the four storage locations in the form of delay registers D1–D4.

Figure 4:
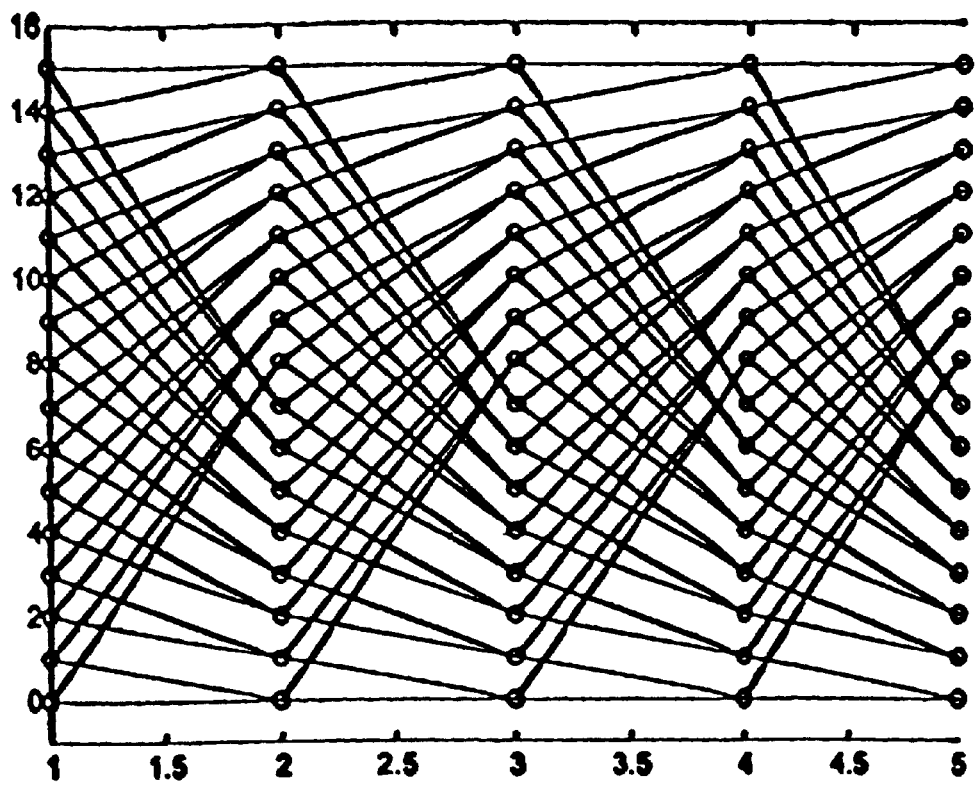
FIG. 4 illustrates a state diagram.

FIG. 4 shows a trellis (state) diagram corresponding to the encoder of FIG. 3. Each node in the vertical direction represents one state of the convolutional encoder 300. The state of the convolutional encoder correspond to the contents of the four delay registers D1–D4. In the encoder of FIG. 3, for each data bit input to the encoder, two symbols are produced, corresponding to the two generating polynomials G1 and G2.

In a receiver, the actual path through the trellis is estimated based on finding paths containing the minimum cumulative errors over time. A new cumulative sum is calculated for each state when the state changes, or every two symbols. Error metrics corresponding to G1 and G2 for that transition may be added, and the minimum cumulative sum is calculated to produce the new cumulative sum value at each node.

That is,

CUMSUM(S,T)=MIN{

CUMSUM[PREV0(S),T−1]+ϵ[SYM(2*T),PREV0(S),S, G1]+ϵ[SYM(2*T+1),PREV0(S),S,G2],

CUMSUM[PREV1(S),T−1]+ϵ[SYM(2*T),PREV1(S),S, G1]+ϵ[SYM(2*T+1),PREV1(S),S,G2]

}, where

CUMSUM(S,T) is the cumulative sum at state S and time T;

MIN(a,b) is the minimum of the two values a and b;

PREV0(S) and PREV1(S) are the two possible previous states preceding state S;

ϵ(SYM, PREV, S, G) is the error metric which is the squared sliced error between the input symbol S and the set partition defined by the transition between states PREV and S using the polynomial G.

Since the error metrics e are always positive, the cumulative sums CUMSUM will grow, except if the channel is perfect and the minimum sliced errors are zero. Because of hardware implementation, the number in each state of the vector CUMSUM can only grow so large before the limitations of the number of bits cause the sum to wrap around. That is, if the number system is implemented as an integer from 0 to 255, then if we add 2 to 254, we will get back to 0, and what should have been a large CUMSUM will look like a small CUMSUM.

In order to maintain the proper relationship among the cumulative sums in a decoder, in order for proper decoding to occur, a fixed number is periodically subtracted from all of the CUMSUM values: that is, when all of the CUMSUM values are greater that some level L, L is subtracted from all of the CUMSUM values. As discussed above, this operation is referred to as renormalization.

The noisier the communication channel used to transmit data to the decoder, the more often renormalization becomes necessary. This is because, as the noise increases, a corresponding increase in the error metrics from the ideal target points in the set partitions will result. In addition, as discussed above, if the set partition synchronization is incorrect, i.e., if the error metrics for G1 symbols are sliced to G2 set partitions, then the cumulative sums of the error metrics will grow more rapidly than if synchronization is correct.

The number of times that renormalization occurs within a predefined analysis period, for example 4096 symbols, is called the renormalization rate. From the renormalization rate a determination can be made of whether polynomial sequence synchronization is correct or not. If the renormalization rate falls below a predetermined threshold, correct set partition synchronization is declared, otherwise incorrect synchronization is declared and the sync with the polynomial sequence and, hence, partition sets is slipped so that a change is made in the selection of the partition set used to decode the data.

In the prior art, the renormalization rate threshold used to establish the presence or absence of sync in this way must be provided externally to the demodulator, e.g., programmed at the time of manufacture or supplied by user or operator of the system. The present invention describes a simple and robust means of automatically establishing the renormalization rate threshold from the received encoded data.

As discussed above, for low noise (high SNR) conditions, the received symbols will have a lower error metric to the transmitted set partition than to another set partition. For example, suppose the two set partitions Set 0 and Set 1 as defined in FIG. 2 are used. Suppose, further, that a sequence of transmitted symbols is $S=\{-5, -3, 1, 3, 1, -1\}$ and that the additive noise vector introduced by the transmission channel is $N=\{0.5, 0, -0.5, 0.1, 0.1, -0.3\}$.

The received symbols will then be $S+N=\{-4.5, -3, 0.5, 3.1, 1.1, -1.3\}$.

The sliced symbols according to Set 0 are $S_0=\{-3, -3, 1, 5, 1, -3\}$.

The sliced symbols according to Set 1 are $S_1=\{-5, -1, -1, 3, 3, -1\}$.

The sliced errors squared to Set 0 are $errsquared_0=\{2.25, 0, 0.25, 3.61, 0.01, 2.89\}$.

The sliced errors squared to Set 1 are $errsquared_1=\{0.25, 4, 2.25, 0.01, 3.61, 0.09\}$.

The sliced errors squared, using the correct set partitions, are $errsquared_{correct}=\{0.25, 0, 0.25, 0.01, 0.01, 0.09\}$.

The minimum of each pair of sliced errors squared, that is, the minimum of errsquared0 and errsquared1 is $errsquared_{min}=\{0.25, 0, 0.25, 0.01\ 0.01, 0.09\}$.

For the case just shown, if we set up a "dummy" cumulative sum, to which we always add the minimum error metric, its value will grow just as the minimum good path in the trellis decoder. If this dummy sum is renormalized at the same level as all the state cumulative sums, then its renormalization rate will be about the same as the renormalization rate when the decoder is in good synchronization. Experimentally, it has been found that the renormalization rate of the state cumulative sums is only slightly more than that of the dummy sum, even under noisy conditions. Therefore, if some small fixed offset is added to the dummy renormalization rate, that sum can be used as a renormalization rate threshold to determine proper synchronization.

Figure 5:
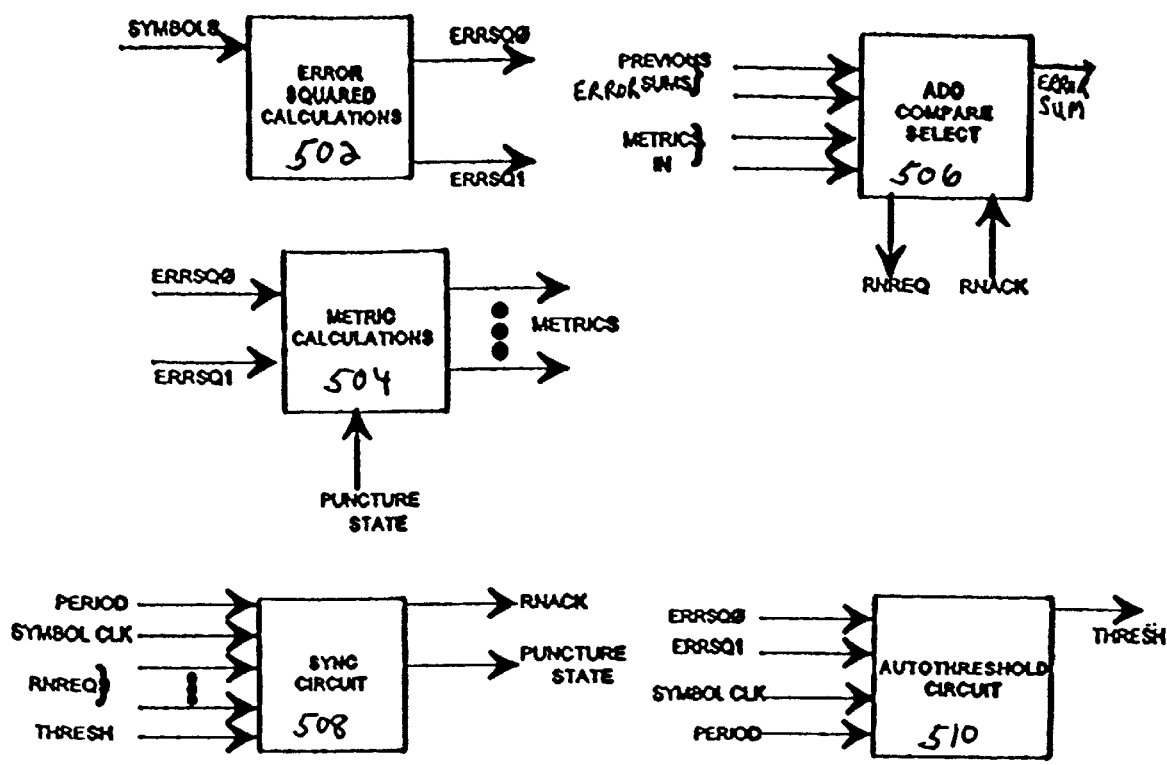
FIG. 5 illustrates the components of a trellis decoder implemented in accordance with the present invention.

FIGS. 5–8 illustrate various components of a trellis decoder system implemented in accordance with the present invention. FIG. 5 illustrates an error squared calculator circuit 502, a metric calculator 504, an add-compare-select circuit 506, a synchronization circuit 508 and an autothreshold circuit 510. The purpose and operation of each of the circuits illustrated in FIG. 5 will be discussed in detail when describing various embodiments of the circuits illustrated in the remaining figures of the application.

While a single add compare-select-circuit 506 is illustrated in FIG. 5, one such circuit would normally be used for each possible encoder state. Accordingly, an error sum is generated and stored for each one of the possible encoder states being considered by the decoder system of the present invention.

Figure 6:
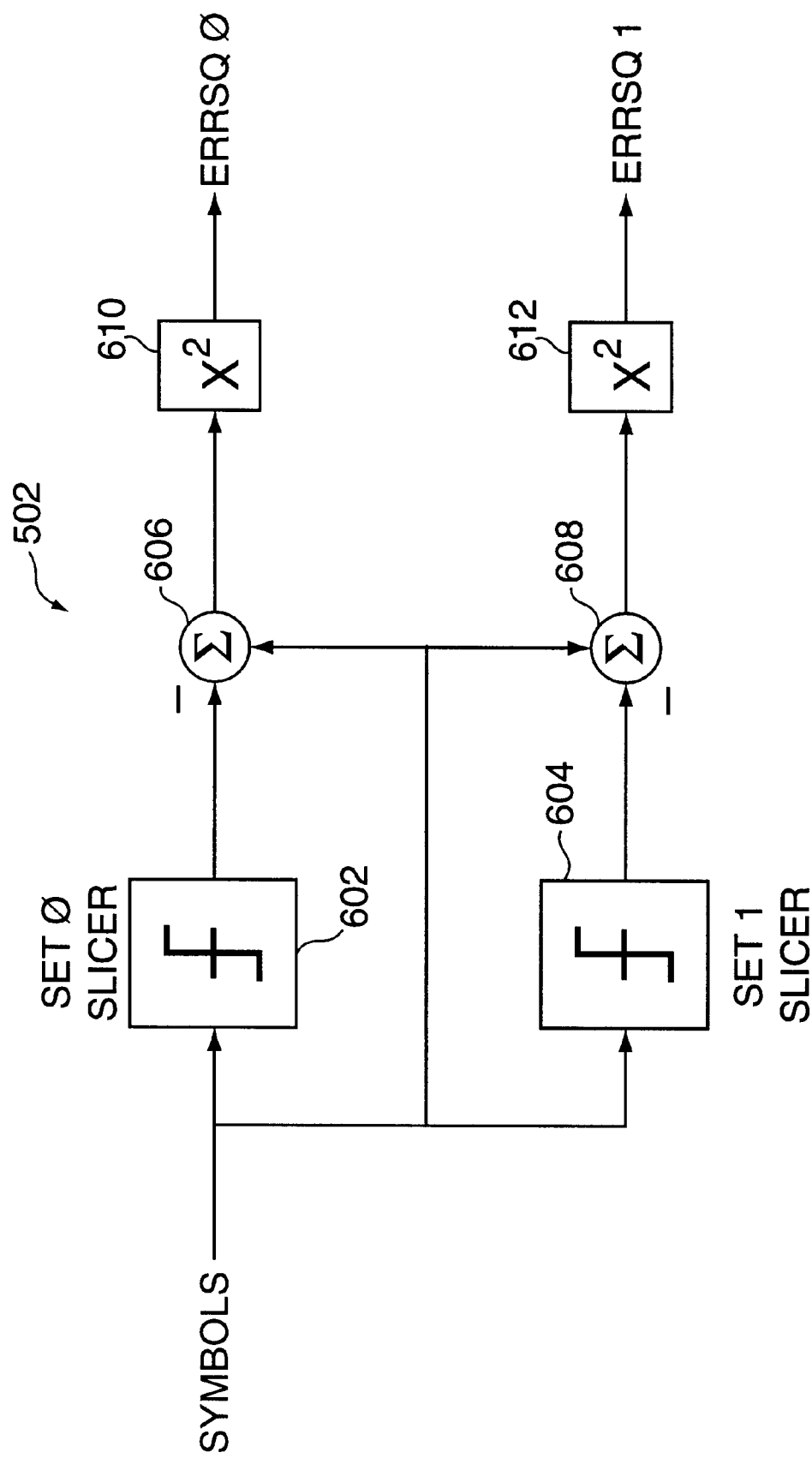
FIG. 6 illustrates an error squared calculation circuit.

The error squared calculator 502 is shown in detail in FIG. 6. It calculates the squared symbol errors to each utilized set partition. In the exemplary embodiment two set partitions are used corresponding to set 0 and set 1. Accordingly, in the exemplary embodiment, two different error estimates, ERRSQ0 and ERRSQ1, are generated. ERRSQ0 reflects the estimated received signal error assuming that the received signal corresponds to partition set 0. ERRSQ1 reflects the estimated received signal error assuming that the received signal corresponds to partition set 0.

The error squared calculator 502 comprises first and second slicers 602, 604, first and second subtracting circuits 606, 608 and first and second squaring circuits 610, 612.

The first error estimate ERRSQ0 is generated by using the slicer 602 to slice a received symbol against the values included in partition set 0 to generate a sliced symbol value. The sliced symbol value generated by the slicer 602 is then subtracted, by the subtractor 606, from the received symbol value used to perform the slicing operation resulting in a sliced error estimate which is supplied to the first squarer 610. The first squarer 610 squares the received sliced error estimate to generate the error estimate ERRSQ0.

The second error estimate ERRSQ1 is generated by using the slicer 604 to slice a received symbol against the values included in partition set 1 to generate a sliced symbol value. The sliced symbol value generated by the slicer 604 is then subtracted, by the subtractor 608, from the received symbol value used to perform the slicing operation resulting in a sliced error estimate which is supplied to the second squarer 612. The second squarer 612 squares the received sliced error estimate to generate the error estimate ERRSQ1.

In the above described manner, the error squared calculation circuit 502 generates two error estimates, ERRSQ0 and ERRSQ1, one corresponding to each set petition used at encoding time. The error squared calculations circuit 502 operates on a per symbol basis. That is, a new set of error estimate outputs, ERRSQ0 and ERRSQ1, is generated with the receipt of each new symbol.

The metric calculator 504 takes the squared errors, ERRSQ0 and ERRSQ1, generated by the circuit 502 and, as a function of the state of the puncture, calculates the metrics to be added to the cumulative sums in the add-compare-select circuits 506. The metric calculations circuit 504, like the add compare select circuit 506, generates its outputs on a per state basis. Since multiple symbols may be transmitted per state, the error metrics output by the metric calculations circuit 504 may be a function of squared errors, ERRSQ0 and ERRSQ1, corresponding to multiple symbols received during a single state time. For example, in the FIG. 10 encoder, during one state time at the encoder, two symbols, one corresponding to each polynomial G1 and G2, may be transmitted.

The number of error metrics generated by the circuit 504, in a given embodiment, will depended on the particular code that is implemented in that embodiment. A decoder designed to decode the code generated by the encoder illustrated in FIGS. 3 and 10, using the puncture code illustrated in FIG. 10, will produces two symbols during one of every 4 states. In such an embodiment, four error metrics would be generated and used per state time. During state times corresponding to one symbol, these error metrics would correspond to the ERRSQ0 and ERRSQ1. During state times corresponding to two symbols, these error metrics would correspond to total error over two symbols: that is, four possible output metrics would be ERRSQ0 for first symbol plus ERRSQ0 for second symbol; ERRSQ0 for first symbol plus ERRSQ1 for second symbol; ERRSQ1 for first symbol plus ERRSQ0 for second symbol; and ERRSQ1 for first symbol plus ERRSQ1 for second symbol.

Figure 7:
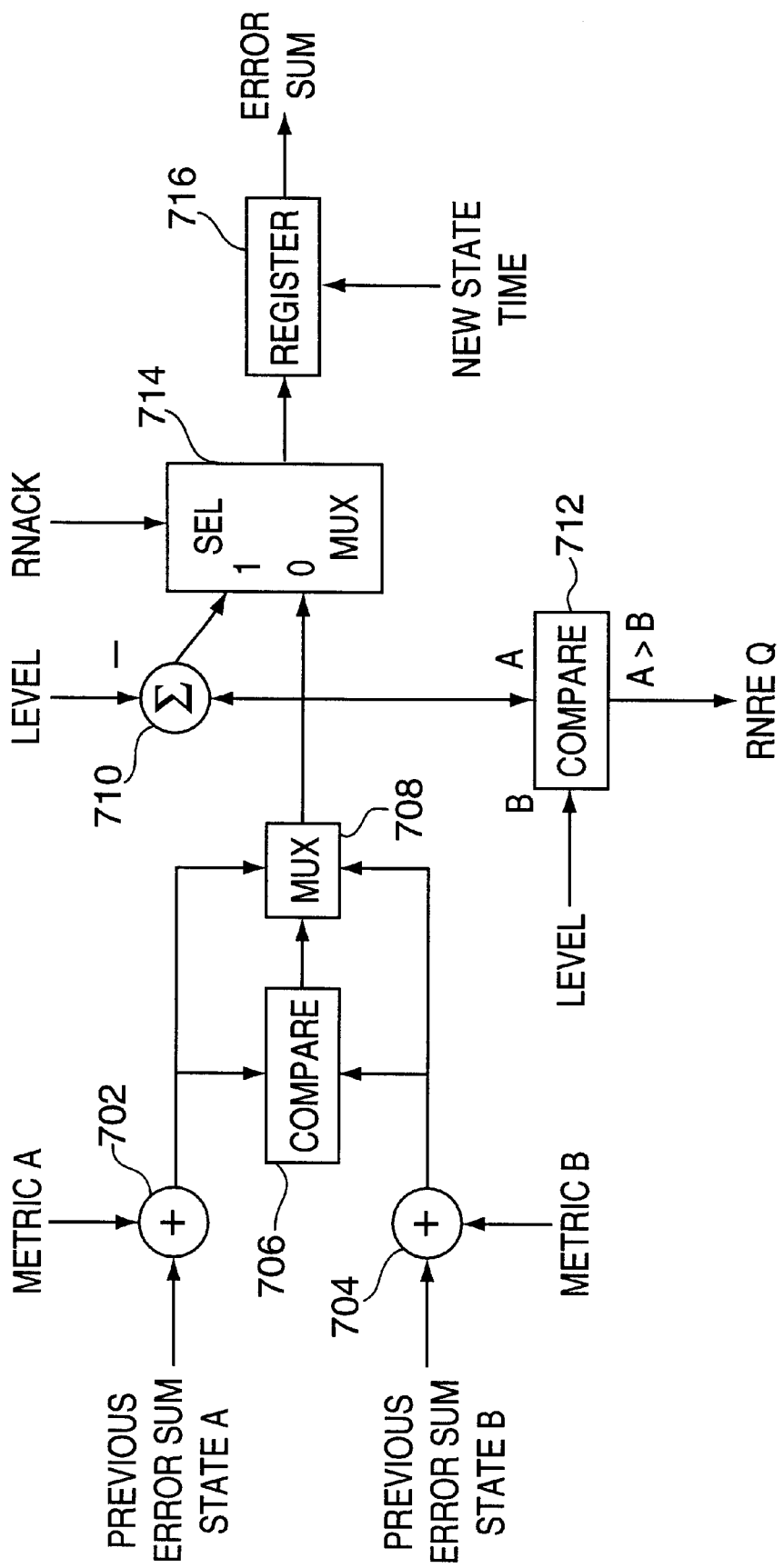
FIG. 7 illustrates an add-compare-select circuit.

An add-compare-select circuit 506 is shown in detail in FIG. 7. One such add-compare-select circuit 506 is used for each possible state. Accordingly, in the case where 16 states are possible as in the embodiment which corresponds to the FIG. 4 state diagram, 16 add-compare-select circuits would be used.

In trellis-coded modulation, each of the possible states can be arrived at by taking two different paths, one path from each of two different possible preceding states, state A and state B. For purposes of explanation, the error metrics associated with the path from state A to the state associated with the particular add-compare-select circuit will be referred to as metrics A and the error metrics associated with the path from state B to the state associated with the particular add-compare-select circuit will be referred to as metrics B.

The add-compare-select circuit 506 comprises first and second summers 702, 704, first and second comparators 706, 712, first and second multiplexers (MUXs) 708, 714, a subtractor 710 and an accumulator register 716.

The previous error sum corresponding to state A is received by a first input of the first summer 702 and added to error metric A to produce a first new error sum. The first new error sum is supplied to a first input of the first comparator 706 and to a first input of the first MUX 708.

The previous error sum corresponding to state B is received by a first input of the second summer 704 and added to error metric B to produce a second new error sum. The second new error sum is supplied to a second input of the first comparator 706 and to a second input of the first MUX 708.

The comparator 706 compares the first and second new error sums and generates an output signal indicative of the smaller input value. The output signal is supplied to a select control input of the MUX 708 thereby causing the MUX 708 to output the smaller of the first and second new error sums. The new error sum output by the first MUX 708 is supplied to a positive input of the subtractor 710, a first input of the second comparator 712 and to a first input of the second MUX 714.

The second comparator 712 is used to determine when the value LEVEL, which is the minimum value which must be exceeded for renormalization to occur, has been exceeded by the new error sum output by the MUX 708. When the new error sum exceeds the value LEVEL which is supplied to a second input of the comparator 712, a renormalization request signal RNREQ is generated, e.g., asserted. When the new error sum is less than LEVEL, the signal RNREQ is de-asserted.

The subtractor 710 and second MUX 714 are used to achieve renormalization, e.g., once the signal RNACK is asserted by the synchronization circuit 508 in response to renormalization request signals (RNREQ) being asserted by each of the add-compare-select circuits 506.

Subtractor 710 subtracts the value LEVEL from the new error sum output by the first MUX 708. When the signal RNACK is asserted indicating that renormalization is to be performed, the output of the subtractor 710 is output by the second MUX 714. However, when the signal RNACK is de-asserted, the new error value supplied to the first input of the MUX 714 is selected for output. The output of the second MUX 714 is temporarily stored in an accumulator register 716 which outputs its contents in response to a clock signal which is generated for each new state time. The output of the second MUX 714 which is stored in the register 716 prior to being output, represents the updated cumulative error sum for the state to which the particular add-compare-select circuit 506 corresponds.

Thus, the circuit 506 takes the previous two possible cumulative sums, adds the appropriate metrics at the appropriate times, selects the minimum (survivor) sum, and updates its cumulative sum at the appropriate times. When the cumulative sum exceeds a value LEVEL, a renormalization request is sent out. When a renormalization acknowledge is received, the cumulative sum is updated by the new error value, i.e., survivor sum, minus the value LEVEL.

Figure 8:
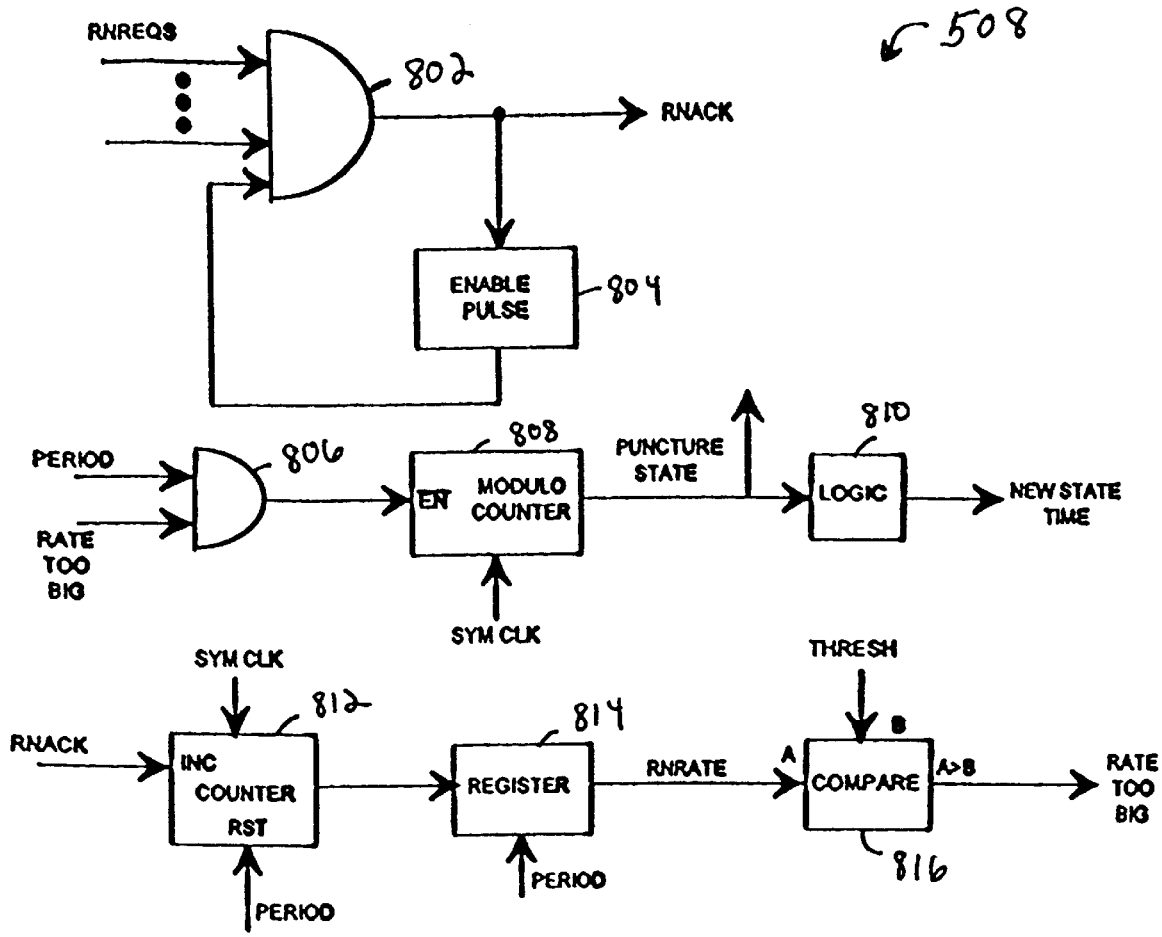
FIG. 8 illustrates a synchronization circuit.

A synchronization circuit 508 is shown in detail in FIG. 8. The synchronization circuit 508 comprises first and second AND gates 802, 806, first and second counters 808, 812, a latch 804 with an inverted output, logic circuit 810, register 814 and comparator 816.

The first AND gate 802 and latch 804 are used for generating a renormalization acknowledgment signal RNACK. The signal RNACK causes the fixed value LEVEL to be subtracted from each of the cumulative sums. As discussed above, this occurs when each of the cumulative sums exceeds the value LEVEL as indicated by the assertion of all the RNREQS signals. In order to prevent the value LEVEL from being repeatedly subtracted, the signal RNACK is asserted for a single state period and then de-asserted.

As illustrated, the RNREQS signals generated by each of the add-compare-select circuits 506 are supplied to inputs of the AND gate 802. In addition the input of the AND gate 802 is coupled to the output of the latch 804. The latch 804, in turn, has an input coupled to the output of the and gate 802. Because the output of the latch 804 is inverted, one clock cycle (state period) after the output, the signal RNACK, of the of the AND gate 802 is asserted, the output of the latch 804 will cause the RNACK to be de-asserted until all or the RNREQS signals are once again asserted.

Thus, a renormalization acknowledge signal RNACK is generated when all cumulative sums request renormalization.

The synchronization circuit's second AND gate 806, first counter 808, and logic circuit 810 are responsible for controlling both the puncture state and the generation of a signal indicative of each new state time period.

The first counter 808 is driven by a system clock which operates at the symbol rate. The counter 808 generates a signal which is indicative of the puncture code used by the decoder. The puncture state signal is supplied to the metric calculation circuit 504 and to the logic circuit 810. The logic circuit 810 generates a new state time signal as a function of the puncture state. When a single symbol is transmitted per state, a new state time signal will be generated at the symbol rate. However, during periods of signal transmission when N symbols, are transmitted per state, a new state time period signal will be generated once for the passage of every N symbol times.

To the control the counter 808, and allow for modification of the puncture state, an inverted enable input of the counter 808 is coupled to the output of the second and gate 806. The AND gate 806 receives two signals as its input, a period signal which is asserted once with each passage of a preselected analysis period and a RATE TOO BIG signal.

The RATE TOO BIG signal is generated in accordance with the present invention using the second counter 812, register 814 and comparator 816.

The counter 812 receives as its inputs the RNACK signal, the system clock signal and the PERIOD signal. The counter is incremented once for each SYM clock period in which the RNACK signal is asserted. The counter 812 is reset at the end of each analysis period in response to assertion of the PERIOD signal. Via the counter 812, the synchronization circuit 508 monitors the renormalization rate during each analysis period. The renormalization count measured during an analysis time period is clocked into the buffer register 814 via assertion of the PERIOD signal. The register 814 holds and outputs the measured renormalization count, reflecting the renormalization rate during the previous analysis period, until a new renormalization count is clocked in.

The comparator is used to compare the renormalization rate value, RNRATE, output by the register 814 to the automatically determined threshold value THRESH. If the renormalization rate is greater than the threshold, the comparator asserts its output thereby causing the RATE TOO BIG signal to be asserted which, in turns causes the puncture state to be slipped via control of the counter 808 by the second AND gate 806. Thus, if the renormalization rate is too big, the synchronization circuit 508 disables the puncture state counter 808 for one symbol clock time during the analysis period, retarding and resynching the clock.

Figure 9:
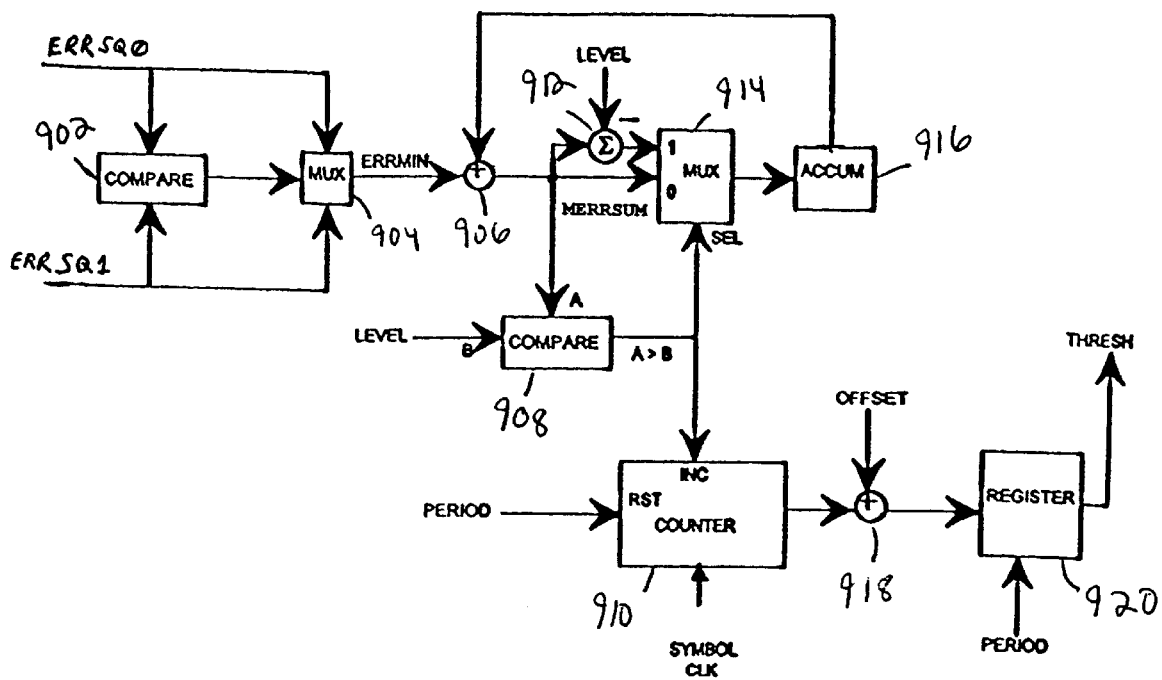
FIG. 9 illustrates an automatic SPARR threshold generation circuit implemented in accordance with one embodiment of the present invention.

The autothreshold circuit 510, shown in FIG. 9, automatically calculates the renormalization rate threshold THRESH for use by the synchronization circuit 508 in accordance with the present invention. The autothreshold circuit 510, comprises first and second comparators 902, 908, first and second MUXs 904, 914, first and second summers 906, 918, a subtractor 912, accumulator 916, counter 910 and register 920.

The error squared error signals which are generated for each received symbol are compared by the comparator 902. The comparator controls the first MUX 904 so that it outputs the smaller of the two error values ERRSQ0 and ERRSQ1, the value ERRMIN. The first summer 906, sums the value ERRMIN to the value stored in the accumulator 916. The resulting minimum error sum MERRSUM is supplied to the input of the second comparator 908, a positive input of the subtractor 912, and a first input of the second MUX 914.

The value LEVEL, which serves as the renormalization rate threshold, is supplied to a negative input of the subtractor 912 and a second input of the second comparator 908. The second comparator 908 asserts its output whenever it detects that the minimum error sum MERRSUM exceeds the renormalization rate threshold LEVEL.

Renormalization of the MERRSUM is achieved by controlling the second MUX 914 to select the output of the subtractor 912 as the input to the accumulator 916 when the output of the second comparator 908 is asserted. The output of the subtractor represents the value MERRSUM minus the renormalization threshold value LEVEL. When the output of the comparator 908 is de-asserted, e.g., because the renormalization level has not been exceeded, the MERRSUM will be output by the second MUX 914. The accumulator 916 receives, stores, and outputs the accumulated minimum partition error value received from the MUX 914.

The second counter 910, which serves as a renormalization rate counter, receives as an increment control signal, the renormalization signal generated by the second comparator 908. Since the counter is also controlled by the symbol clock, it is incremented at most, once for each received symbol when the renormalization signal is asserted. The counter 910 is rest in response to assertion of the analysis period signal PERIOD. Thus, the value stored in the counter 910 at the end of an analysis period, represents the renormalization rate of the minimum accumulated error sum stored in accumulator 916.

In accordance with the present invention, an offset value OFFSET is added, by the second summer 918, to the renormalization rate value output by the counter 910 to thereby automatically generate the resynchronization threshold THRESH. The analysis period control signal PERIOD is used to control the clock of the value THRESH generated by the summer 918 into the register 920. The register 920 outputs the generated threshold value THRESH stored in the register until the stored value is replaced by an updated value, e.g., at the end of each analysis period.

Thus, the autothreshold circuit 510 takes the error squared signals, ERRSQ0 and ERRSQ1, selects the minimum of them, and integrates this minimum error in the accumulator 916. When the accumulator 916 reaches a level LEVEL, the accumulator subtracts the level LEVEL, and a counter is incremented. At the end of the analysis period, a fixed offset OFFSET is added to the renormalization rate of the accumulator 916, thereby automatically producing the renormalization rate threshold THRESH that is used by the synchronization circuit 508.

Notice that the set partition slicers 602, 604, error-squared calculations, and analysis period counter are required by the rest of the trellis decoder, so that little additional circuitry is being added to a conventional decoder to implement the method and apparatus of the present invention.

The SPARR threshold generation circuitry of the present invention can be used in a system employing punctured coding. In such a system, more than one polynomial is used, so that more than one set partition bit may be encoded for each data bit entering the trellis encoder. However, with a punctured code, the output of each polynomial need not be used for each data bit entering. Consider the system of FIG. 10. Here, there are two polynomials used, however the commutator, switch 309, is used according to the puncture matrix shown, such that polynomial G2 is used to encode three set partitions for the first three bits entering, then polynomial G1 and G2 are both used to encode two set partitions for the fourth bit entering. Thus, a total of five set partitions used in five transmitted symbols are used for every four data bits entering the trellis encoder 300. The code is therefore referred to as a rate 4/5 code.

Figure 10:
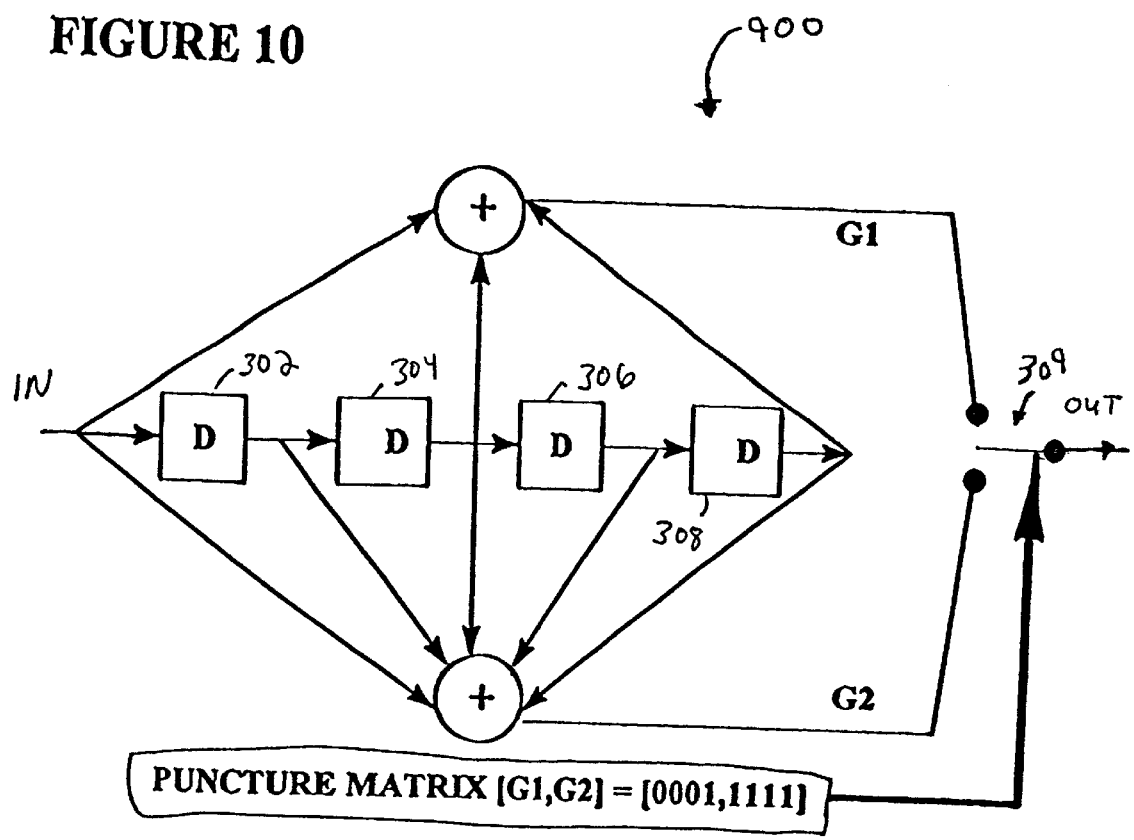
FIG. 10 illustrates a trellis encoder with punctured code.

With regard to the system of FIG. 10, the same synchronization problem exists as in FIG. 3, except that, for this punctured code, five possible states of synchronization exist for the FIG. 10 system. Just as before, in accordance with the present invention a dummy accumulator 916 is used to estimate the renormalization rate when in the correct synchronization. If the actual renormalization rate exceeds the estimate, the synchronization is changed by, e.g., one. In the FIG. 10 system, it may take four analysis periods before the synchronization slips into the correct one.

The above discussed methods and apparatus of the present invention are useful over a wide range of applications where trellis-coded modulation (TCM) is employed. For example, the present invention can be used in cable modems where trellis-coded QAM (quadrature-amplitude modulation) is used. One way of achieving this synchronization is to monitor the rate at which cumulative sums are renormalized in the decoder, i.e., the renormalization rate.

What is claimed is:

1. A method of generating a synchronization comparison threshold for use in a decoder which decodes received signals including data using a plurality of set partitions, the method comprising the steps of:

receiving a series of encoded symbols; and generating said synchronization comparison threshold from an error renormalization rate and a control signal generated from received signals which have not been fully decoded, the synchronization comparison threshold being a function of set partitions utilized as part of a decoding process.

2. The method of claim 1, wherein the step of automatically generating a synchronization threshold includes the steps of:

for each received symbol:
  i. generating a separate error estimate for each one of the utilized set partitions; and
  ii. selecting the minimum generated error estimate for use in generating the synchronization threshold.

3. The method of claim 2, further comprising the step of:

summing the minimum generated error estimates for a series of symbols to generate a minimum accumulated error sum.

4. The method of claim 3, further comprising the step of:

periodically comparing the minimum accumulated error sum to renormalization threshold value.

5. The method of claim 1, wherein the generated synchronization threshold is a set partition adjustment renormalization rate threshold.

6. The method of claim 1, wherein the method is further directed to using the generated synchronization comparison threshold, the method further comprising the step of:

comparing said synchronization comparison threshold to renormalization rate.

7. The method of claim 1, wherein said control signal is a minimum set partition error signal.

8. The method of claim 1, wherein the error renormalization rate is the rate at which a sum of values represented by said control signal is renormalized over time.

9. A method of generating a synchronization threshold for use in a decoder which decodes received data using a plurality of set partitions, the method comprising the steps of:

receiving a series of encoded symbols; and automatically generating a synchronization threshold as a function of the received symbols and the utilized set partitions, the step of automatically generating a synchronization threshold including for each received symbol:
  i. generating a separate error estimate for each one of the utilized set partitions; and
  ii. selecting the minimum generated error estimate for use in generating the synchronization threshold;

summing the minimum generated error estimates for a series of symbols to generate a minimum accumulated error sum;

periodically comparing the minimum accumulated error sum to a renormalization threshold value;

performing a renormalization operation each time the minimum accumulated error sum exceeds the renormalization threshold value; and measuring the under of times the renormalization of the minimum accumulated error sum occurs in a preselected time period.

10. The method of claim 9, further comprising the step of:

adding a preselected value to the measured number to generate said synchronization threshold.

11. The method of claim 10, wherein the preselected value is a fixed positive offset and wherein the preselected time period is a time period equal to an integer multiple of the received symbol period.

12. The method of claim 10, wherein the method is also directed to the use of the generated threshold, the method comprising the step of:

generating cumulative error sums as part of a decoding operation;

periodically performing a renormalization operation on the cumulative error sums;

measuring the cumulative error sum renormalization rate; and comparing the measured cumulative error sum renormalization rate to the generated threshold to determine whether the decoding operation is properly synchronized.

13. The method of claim 12, wherein the generated synchronization threshold is a set partition adjustment renormalization rate threshold.

14. A method of performing a trellis decoding operation, the method comprising the steps of:

receiving a plurality of encoded symbols;

generating a set partition adjustment renormalization rate threshold from information including an error renormalization rate and a control signal generated from received symbols which have not been fully decoded; and performing a decoding operation using the generated set partition adjustment renormalization rate threshold.

15. The method of claim 14, wherein the step of generating the set partition adjustment renormalization rate threshold includes the step of maintaining a cumulative sum of minimum set partition errors.

16. The method of claim 15, wherein the step of generating the set partition adjustment renormalization rate threshold further includes the step of determining a renormalization rate of the cumulative sum of the minimum set partition errors.

17. The method of claim 14, wherein the step of performing a trellis decoding operation includes the step of:

comparing said set partition adjustment renormalization rate threshold to a renormalization rate.

18. A decoder circuit for decoding received signals, comprising:

means for generating a renormalization rate signal from said received signals; and means for dynamically generating a synchronization comparison threshold from the renormalization rate and a control signal generated from received signals which have not been fully decoded.

19. The decoder circuit of claim 18,
wherein the means for generating a plurality of error signals includes a plurality of slicers.

20. The decoder circuit of claim 18,
wherein the means for generating a plurality of error signals includes means for generating at least one error signal for each of a plurality of encoder partition sets used by the decoder circuit.

21. The decoder circuit of claim 18, wherein the means for dynamically generating a synchronization threshold includes:
   a minimum error selection circuit for selecting the minimum one of the plurality of error signals generated from the received symbol; and
   an adder for adding the minimum error signal to a sum of minimum error signals.

22. The decoder circuit of claim 21, further comprising:
   means for performing a renormalization operation on the sum of minimum error signals; and
   means for generating the synchronization threshold value as a function of the rate at which the sum of minimum error signals is renormalized.

23. The decoder circuit of claim 22, wherein the decoder circuit is a trellis decoder circuit, the decoder circuit further comprising:
   means for supplying a series of symbols to the means for generating a plurality of error signals; and
   means for generating a plurality of cumulative error sums;
   means for performing a renormalization operation on the cumulative error sums; and
   means for performing a synchronization operation when the renormalization rate of the cumulative error sums exceeds the dynamically generated synchronization threshold.

24. The decoder circuit of claim 18, further comprising:
   a comparator coupled to said means for dynamically generating a synchronization comparison threshold for comparing a renormalization rate to said synchronization comparison threshold.

* * * * *